United States Patent [19]

Komatsu et al.

[11] Patent Number: 5,033,972
[45] Date of Patent: Jul. 23, 1991

[54] ELECTRICAL CONNECTOR

[75] Inventors: Yasuhiro Komatsu, Osaka; Masahiko Umekawa, Tondabayashi, both of Japan

[73] Assignee: Hosiden Corporation, Yao, Japan

[21] Appl. No.: 653,269

[22] Filed: Feb. 11, 1991

[30] Foreign Application Priority Data

Apr. 26, 1990 [JP] Japan ............................... 2-45659[U]

[51] Int. Cl.⁵ ............................................. H01R 13/62
[52] U.S. Cl. ..................................... 439/153; 439/377
[58] Field of Search ............................... 439/152-160, 439/296, 297, 377; 361/413, 394, 395, 415

[56] References Cited

U.S. PATENT DOCUMENTS

| 4,366,680 | 8/1984 | Sakai et al. | 439/159 |
| 4,778,401 | 10/1988 | Boudreau et al. | 439/157 |
| 4,887,188 | 12/1989 | Yoshida et al. | 439/153 |
| 4,952,161 | 8/1990 | Komatsu | 439/159 |

Primary Examiner—David L. Pirlot
Attorney, Agent, or Firm—Jones, Tullar & Cooper

[57] ABSTRACT

The electrical connector in accordance with the present invention may be used for signal transmission/reception between a card and a circuit of a machine concerned, for example. The electrical connector has a frame to which attached are a rear structure having a card inserting/pulling port and a connector body having a contact group. Also attached to the frame are a longitudinally movable slider and a shaft having a swing fulcrum. The slider has engagement pawls adapted to be engaged with a card, and the shaft has an operating knob having a card holding portion. When the slider advances with the insertion of a card, the shaft is swung so that the operating knob is pushed out and the holding portion comes in contact with the rear end surface of the card, thereby to prevent the card from being erroneously pulled out.

7 Claims, 4 Drawing Sheets

ELECTRICAL CONNECTOR

BACKGROUND OF THE INVENTION

1. Field of the Invention

The present invention relates to an electrical connector through which a contact group of a memory card is connected to a circuit of a machine such as a computer or the like.

A multi-pole electrical connector is often arranged such that, in order to reduce the deformation of individual contacts forming a contact group of the connector, as well as to prevent the precision from being lowered, such contacts are adapted to overlap, by short distances, contacts forming a contact group of a memory card when the same is inserted into the connector. Further, the multi-pole electrical connector is often arranged such that the fixation of the memory card at the setting position is maintained by a contact pressure between the contact group of the memory card and the contact group of the connector.

There is known an electrical connector of the type above-mentioned in which, when inserting a memory card into the setting position therein, the contacts of the memory card come in contact with the contacts of the connector immediately before the memory card reaches the setting position, in which, when the memory card is then pushed into the setting position, the contacts of both the memory card and the connector overlap by a distance corresponding to the distance of such a movement of the memory card thus pushed, and in which the memory card is fixed at the setting position by a contact pressure between the contact groups of both the card and the connector. In such a connector, a suitable overlapping distance of the contacts of the connector on the contacts of the card may be set to 5 to 6 mm, or 1 mm or less.

2. Description of the Invention

To prevent a memory card inserted into the setting position in an electrical connector of the type above-mentioned, from being erroneously pulled out, it is proposed to provide a machine on which the connector is to be mounted, with a memory card inserting/pulling port having such a lid as to prevent the memory card at the setting position from being held by the hand.

In a connector in which the contact overlapping distance is very short, however, when the memory card as properly inserted into the setting position is moved in the pulling direction, this involves the likelihood that the contacts of the memory card are separated from the contacts of the connector even though the movement of the memory card is very small. Accordingly, there are instances where, in a connector mounted on, for example, a motor vehicle apt to receive vibration, the memory card properly inserted into the setting position is gradually moved in the pulling direction due to vibration exerted to the connector, so that the contacts of the memory card are separated from the contacts of the connector, thus causing the inconvenience of injury to the state of signal transmission/reception between the memory card and the connector. Such inconvenience may also be caused when the memory card is erroneously manually pulled out from the proper position.

To prevent such inconvenience, it may be proposed to arrange the connector such that, when the memory card is retreated from the proper setting position, the connector is capable of immediately detecting such a retreat. In order that the connector having contacts adapted to overlap the contacts of the memory card by a very short distance, is provided with such a function, it is required to dispose a mechanism for detecting, without fail, a retreat of the memory card even though the distance of such a retreat is small. However, such a mechanism requires high precision to increase the cost, leading to increase in cost of the connector in its entirety.

It may also be proposed to dispose a lid at the memory card inserting/pulling port. However, such a lid not only decreases the maneuverability of inserting/pulling a memory card, but also requires a lid mounting space. Thus, the provision of such a lid not only presents disadvantages in view of maneuverability and mounting space, but also increases the production cost.

SUMMARY OF THE INVENTION

In view of the foregoing, the present invention is proposed with the object of providing an electrical connector of which contacts are adapted to overlap, by a very short distance, the contacts of a card such as a memory card when the same is inserted in the electrical connector, which prevents the card inserted into the setting position from being accidentally pulled out, without the card inserting/pulling maneuverability lowered, and which detects, with a simple mechanism, the fact that the card inserted therein has been properly pulled out.

It is another object of the present invention to provide a thin electrical connector.

It is a further object of the present invention to provide a multi-pole electrical connector which prevents the card inserted therein from being accidentally pulled out and which securely detects the fact that the card inserted therein has been properly pulled out.

To achieve the objects above-mentioned, the electrical connector in accordance with the present invention comprises:

a rear structure having a card inserting/pulling port;

a connector body having a contact group which is an assembly of contacts respectively formed on a plurality of contact pieces;

a frame to which the rear structure and the connector body are attached such that the card inserting/pulling port and the contact group face each other with a distance provided therebetween;

a slider longitudinally movably disposed, as overlapping the frame, between the card inserting/pulling port and the contact group;

engagement pawls disposed at the slider and adapted to be engaged, only in the card insertion direction, with a card when the same is inserted into the connector through the card inserting/pulling port;

a shaft provided at the intermediate portion thereof with a swing fulcrum, the shaft having one end connected to the slider and the other end which transversely extends outside of the frame;

an operating knob connected, sideways of the card inserting/pulling port, to the other end of the shaft, the operating knob being swingable in the directions toward and away from the card inserting/pulling port;

a spring for resiliently biasing the operating knob normally int he direction toward the card inserting-/pulling port; and a holding portion disposed at the free end of the operating knob and adapted to project to and partially close the inlet of the card inserting/pulling port when the operating knob approaches the card inserting/removing port.

According to the electrical connector having the arrangement above-mentioned, when a card is being inserted through the card inserting/pulling port with the holding portion of the operating knob moved sideways of the card inserting/pulling port at the inlet thereof, the engagement pawls of the slider are engaged with the card and the slider advances as pushed by the card. With the advancement of the slider, the shaft is rotated around the swing fulcrum and the operating knob is pushed out, sideways of the card inserting/pulling port, in the opposite direction with respect to the slider. When the card is inserted into the setting position and the contact group of the card comes in contact with the contact group of the connector, the operating knob is moved in the direction toward the card inserting-/pulling port by force of the spring. At the same time, the holding portion of the operating knob projects to the inlet of the card inserting/pulling port and closes the card inserting/pulling port. Accordingly, even though the card is tried to be retreated from the setting position, the card cannot be retreated unless the operating knob is rotated in the direction away from the card inserting/pulling port so that the holding portion is moved away from the inlet of the card inserting/pulling port. In other words, to pull out the card, it is required that the operating knob is rotated in the direction away from the card inserting/pulling port so that the holding portion is moved away from the inlet of the card inserting/pulling port.

In the state where the card is inserted into the setting position, when the operating knob is pushed in after the holding portion has been moved sideaways of the card inserting/pulling port at the inlet thereof so that the card inserting/pulling port is opened, such a pushing movement is transmitted to the slider through the shaft. Accordingly, the slider is retreated so that the card is forcibly pushed out in the pulling direction by the engagement pawls.

To carry out the operations above-mentioned, the electrical connector of the present invention is arranged such that the holding portion of the operating knob is adapted to come in contact with a card when the same is inserted into the setting position, thereby to prevent the card from being retreated. This prevents the accident that the contacts of the card are unexpectedly separated from the contacts of the connector due to vibration or the like, causing no signal to be transmitted/received between the card and the connector. The card can be retreated only after the holding portion has been moved away from the card inserting/pulling port. To move the holding portion away from the card inserting/pulling port, it is required to rotate the operating knob in the direction away from the card inserting/pulling port. Accordingly, the fact that the card has been pulled out, may be securely detected by the actual position of the operating knob. The operating knob can be pushed in only after the holding portion has been moved sideways of the card inserting/pulling port. Further, it hardly occurs that the operation for moving away the holding portion is erroneously carried out. Accordingly, it hardly occurs that the card is accidentally pulled out because the operating knob has been erroneously pushed in.

According to the present invention, the engagement pawls may stand from the slider body at both transverse sides of the tip thereof. In such an electrical connector, a card inserted on the slider may be securely engated, at the front end thereof, with the engagement pawls.

According to the present invention, the slider may have a stepped portion and may be provided at the front of the stepped portion with a wide slider body and at the rear of the stepped portion with a narrow tongue piece. The slider body may be provided at both transverse sides of the tip thereof with guide pieces which project outwardly therefrom. The guide pieces may be guided by the connector body in the longitudinal direction thereof, while the tongue piece may be guided, as housed in a longitudinal guide hole formed in the frame, in the longitudinal direction of the connector. In such an electrical connector, the forth-and-back movement of the slider is smoothed.

According to the present invention, the card inserting/pulling port of the rear structure may be formed by two opposite groove forming portions and a bottom plate disposed therebetween. One of the groove forming portions may have a frame portion which incorporates a microswitch of which actuator faces the inner wall surface of the operating knob. In such an electrical connector, the actuator of the microswitch may be switched in association with the swing of the operating knob.

According to the present invention, the swing fulcrum of the shaft may be formed by attaching the intermediate portion of the shaft to the frame by a connection pin. Such an electrical connector may be made thin.

According to the present invention, the swing portion of the operating knob may be disposed sideways of the card inserting/pulling port. Such an electrical connector may be made thin.

Other features and effects of the present invention will be apparent from the following description of an embodiment thereof with reference to the attached drawings.

DETAILED DESCRIPTION OF THE PREFERRED EMBODIMENTS

Figure 1:
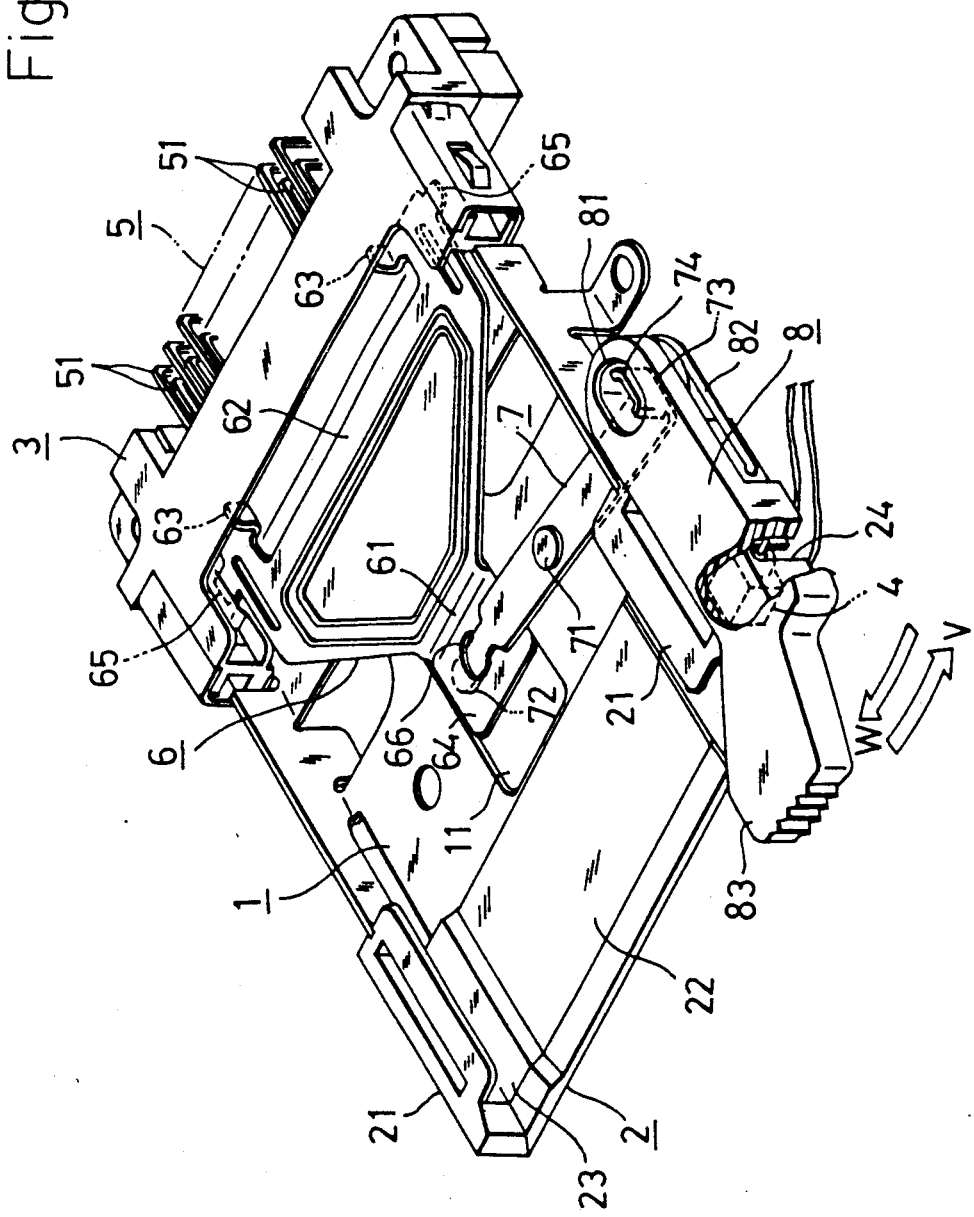
FIG. 1 is a perspective view, with portions broken away, of an electrical connector in accordance with the present invention.

In FIG. 1, a substantially rectangular frame 1 having a great flexural rigidity is made by applying predetermined machinings on a metallic sheet. A rear structure 2 is assembled with the frame 1 at the rear end thereof. The rear structure 2 is provided at both transverse ends thereof with groove forming portions 21 which are inwardly turned. The rear structure 2 also has a bottom plate 22. The opposite groove forming portions 21 and the bottom plate 22 form a card inserting/pulling port 23. The frame 1 is provided at the front end thereof with a connector body 3. The connector body 3 has a contact group 5 which is an assembly of a number of contact pieces 51. Contacts are formed on those portions of the contact pieces 51 which project rearwardly of the connector body 3. All the contacts as an assembly, form a contact group 52 of the connector (See FIGS. 3 to 5). As discussed in the foregoing, the rear structure 2 and the connector body 3 are assembled with the frame 1, so that the card inserting/pulling port 23 is opposite to the contact group 52 with a distance provided therebetween.

A slider 6 is disposed, as overlapping the frame 1, between the card inserting/pulling port 23 and the contact group 52. The slider 6 has a stepped portion 61. The slider 6 is provided at the front of the stepped portion 61 with a wide slider body 62 and at the rear of the stepped portion 61 with a narrow tongue piece 64. The slider body 62 is provided at both transverse sides of the tip thereof with engagement pawls 63 which upwardly stand therefrom. The slider body 62 also has guide pieces 65 which project outwardly from both transverse sides of the tip of the slider body 62. The tongue piece 64 is housed in a longitudinal guide hole 11 formed in the frame 1. The slider 6 is longitudinally movable. A smooth longitudinal movement of the slider 6 is assured by the fact that the guide pieces 65 are guided by the connector body 3 and that the tongue piece 64 is guided by the guide hole 11. When a card C (not shown in FIG. 1) is being inserted on the slider 6 through the card inserting/pulling port 23, the engagement pawls 63 are engaged, only in the card inserting direction, with the front end $C_1$ of the card C in the middle course of such insertion. When the front end $C_1$ of the card C is engaged with the engagement pawls 63 at the time when the slider 6 is located in a position shown in FIG. 4, the subsequent insertion of the card C causes the slider 6 to follow the card C. Thus, the slider 6 advances to a position shown in FIG. 5. On the contrary, when the slider 6 is retreated from the position in FIG. 5 to the position in FIG. 4, the engagement pawls 63 forcibly push out the card C in the card pulling direction Y shown in FIG. 3.

The intermediate portion of a shaft 7 is attached to the frame 1 by a connection pin 71, so that the shaft 7 is swingable with a predetermined position, i.e., the setting position of the connection pin 71, serving as a swing fulcrum. One end 72 of the shaft 7 is inserted into a connection hole 66 formed in the tongue piece 64 of the slider 6, thus connecting the one end 72 to the slider 6. The other end 73 of the shaft 7 extends transversely outwardly of the frame 1 and has a turned piece 74.

Figure 2:
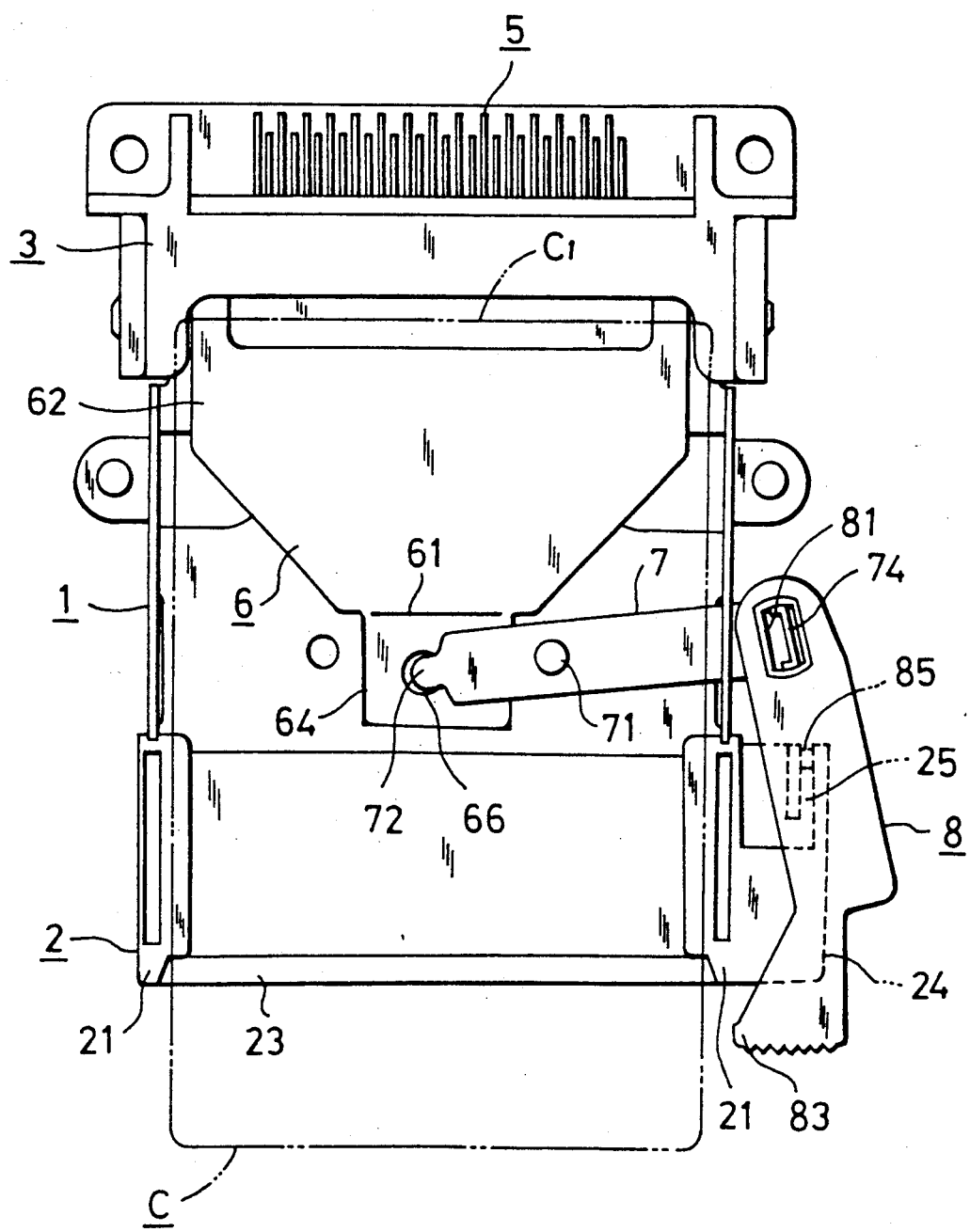
FIG. 2 is a plan view of the electrical connector in FIG. 1.

As shown in FIG. 1 or 2, a frame portion 24 is formed integrally with one of the groove forming portions 21 of the rear structure 2. The frame portion 24 incorporates a microswitch 4. The frame portion 24 has a longitudinally extending guide groove 25.

An operating knob 8 is provided in the front portion thereof with a hole 81. The turned piece 74 of the shaft 7 is rotatably fitted into the hole 81. Thus, the operating knob 8 is swingingly connected to the other end 73 of the shaft 7. Accordingly, the operating knob 8 may be swung, sideways of the card inserting/pulling port 23, in the directions toward and away from the card inserting/pulling port 23. Further, the operating knob 8 is hollow and fitted to the frame portion 24. In this connection, the swinging directions of the operating knob 8 are regulated, by the frame portion 24, to the directions toward and away from the card inserting/pulling port 23. A spring 82 is disposed between the frame portion 24 and the operating knob 8 and resiliently biases the operating knob 8 normally in the direction W toward the card inserting/pulling port 23. As shown in FIG. 2, the operating knob 8 is provided at the inner surface of the hollow portion thereof with a projection 85, which is slidably fitted in the guide groove 25 in the frame portion 24.

Figure 3:
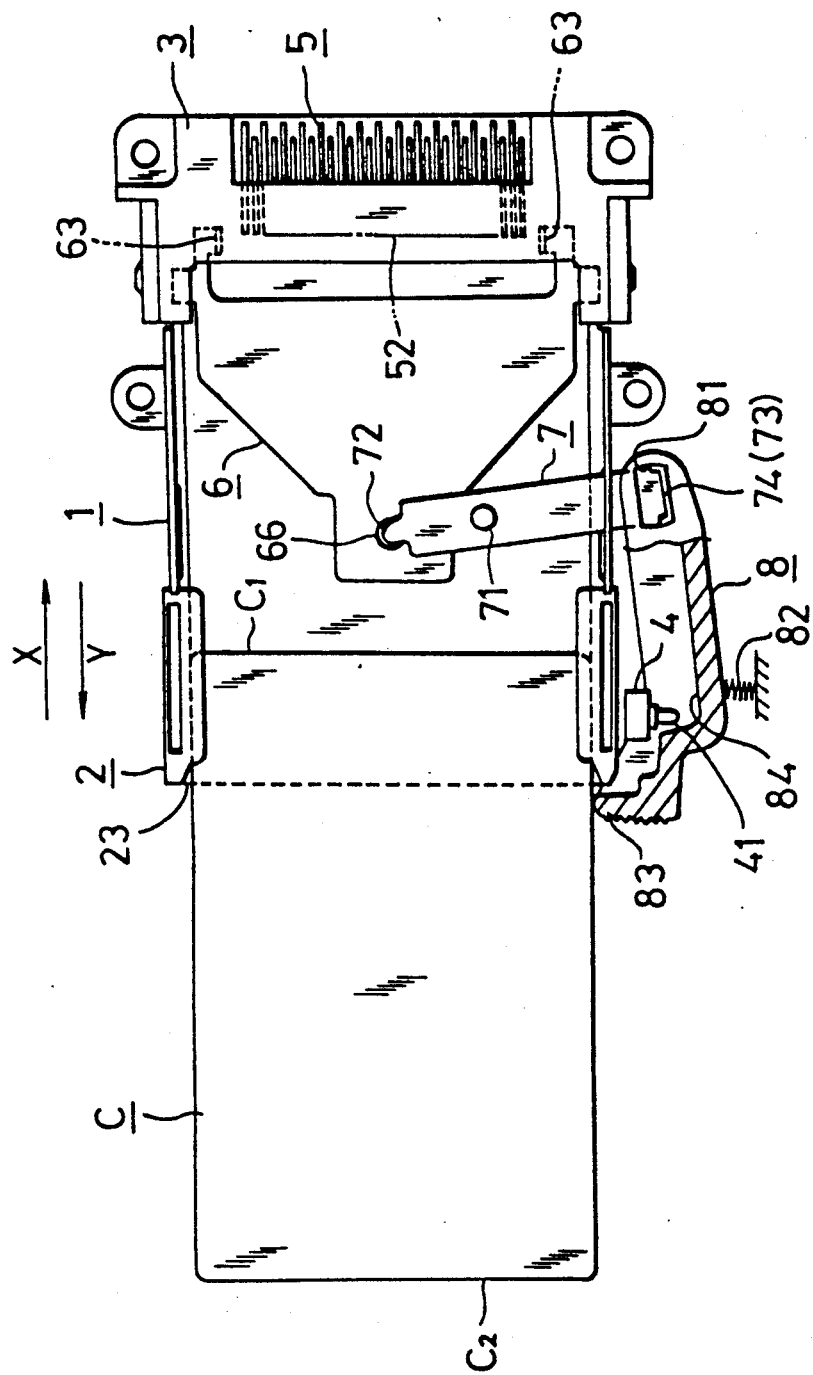
FIGS. 3 to 5 are views illustrating the operation of the electrical connector in FIG. 1.
Figure 4:
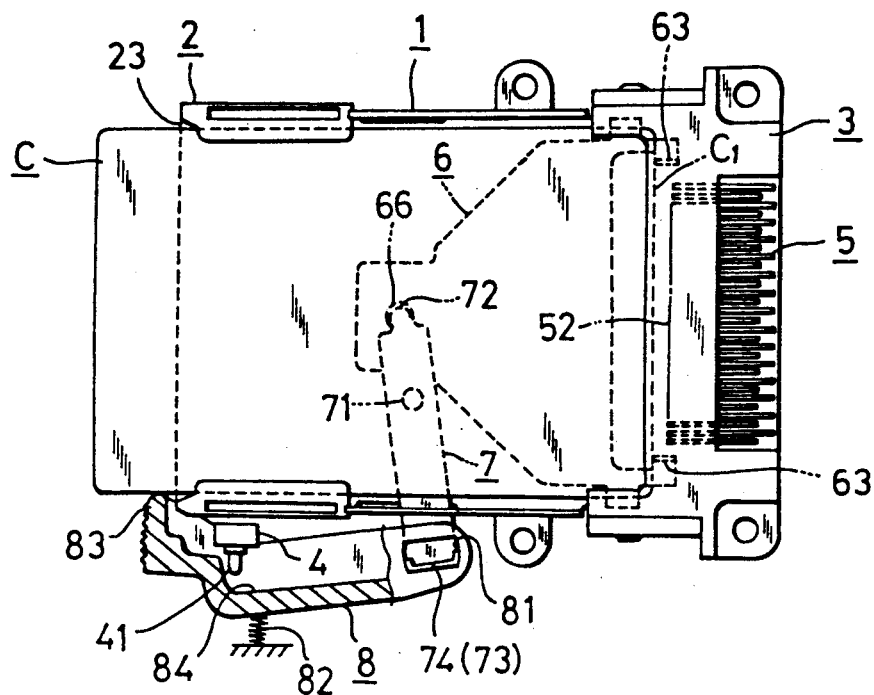
Figure 5:
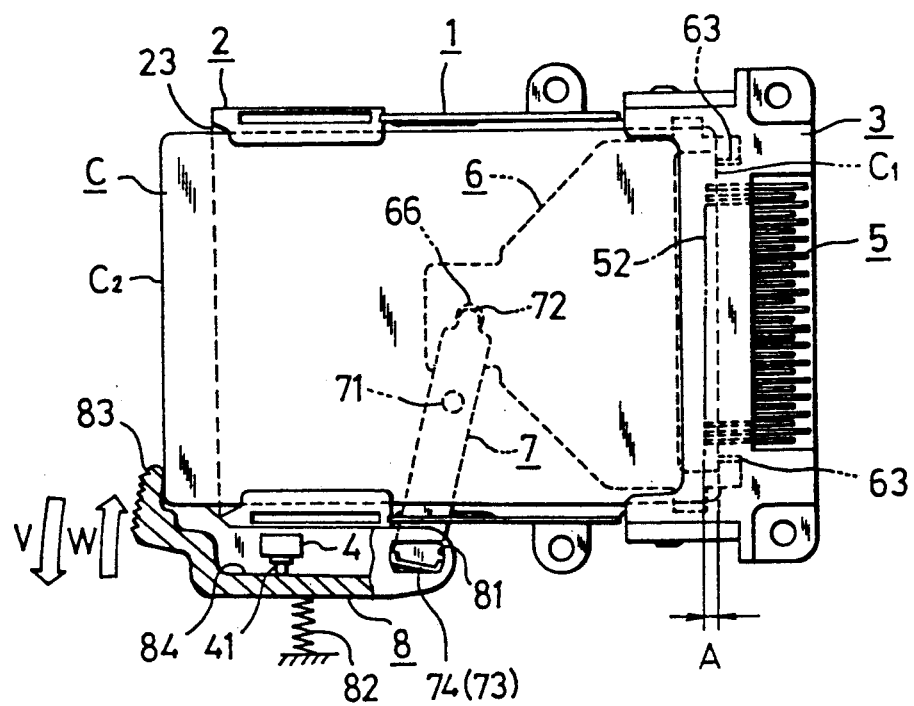

The operating knob 8 is provided at the free end thereof with a holding portion 83 in the form of a hook. This holding portion 83 is formed integrally with the operating knob 8 so that the holding portion 83 and the operating knob 8 generally form an L-shape. When the operating knob 8 approaches the card inserting/pulling port 23, the holding portion 83 projects to and partially closes the inlet of the card inserting/pulling port 23 as shown in FIGS. 1 and 5. When the operating knob 8 is separated from the card inserting/pulling port 23, the holding portion 83 is moved sideways of the inlet of the card inserting/pulling port 23 as shown in FIGS. 3 and 4. When the card C is inserted into the setting position as shown in FIG. 5, the holding portion 83 projects to the inlet of the card inserting/pulling port 23 and comes in contact with the rear end surface $C_2$ of the card C.

The card C is provided at the front end $C_1$ thereof with one or more rows of a plurality of small holes in each of which a contact piece is disposed, so that contacts are formed. A contact group (not shown) which is an assembly of individual contacts, corresponds to the contact group 52 of the connector. When the card C is inserted into the setting position (to be discussed later) through the card inserting/pulling port 23, the contacts of the connector are respectively inserted into the small holes of the card C, so that the contacts of the card C are adapted to respectively come in contact with the contacts of the connector. When the card C is moved from the setting position in the pulling direction Y shown in FIG. 3, the contacts of the card C are adapted to be separated from the contacts of the connector. In FIG. 5, a mark A represents the distance by which the contacts of the card C inserted into the setting position overlap the contacts of the connector. This overlapping distance does not refer to the length of those portions of the contacts of the card C which come in contact with portions of the contacts of the connector. That is, the respective contacts of the card C generally come in point-contact with the respective contacts of the connector, and the contacting positions are set slightly rearwardly of the front end surface of the card C. Accordingly, the overlapping distance A refers to the length of that portion of each contact of the contact group of the card C which overlaps a portion of each contact of the contact group of the connector, including the contacted part and the non-contacted part of each contact. The overlapping distance A is set to about 1 to 2 mm, or 1 mm or less.

The microswitch 4 has an actuator 41 which faces the inner wall surface 84 of the operating knob 8. When the operating knob 8 is swung in the direction W toward the card inserting/pulling port 23 so that the holding portion 83 projects to the inlet of the card inserting/pulling port 23, the actuator 41 is pushed in by the inner wall surface 84 of the operating knob 8 as shown in FIG. 5. On the contrary, when the operating knob 8 is swung in the direction V apart from the card inserting/pulling port 23 so that the holding portion 83 is moved sideways of the inlet of the card inserting/pulling port 23, the inner wall surface 84 of the operating knob 8 is separated from the actuator 43, causing the actuator 43 to project, as shown in FIGS. 3 and 4. As the microswitch 4, there may be used a microswitch which is adapted to provide a state where a signal is permitted to be transmitted/received between the card C and the circuit of a machine concerned when the actuator is pushed in, and which is adapted to provide a state where no inconvenience is caused even though the card C is disconnected from the machine circuit, thereby to protect the program of the card C or the machine, when the actuator projects.

In the connector above-mentioned, when the card C is not being inserted, the slider 6 is located in the retreat position and the projection 85 of the operating knob 8 is housed in the guide groove 25. Accordingly, the holding portion 83 is located, as moved away, sideways of the card inserting/pulling port 23.

When the card C is being inserted through the card inserting/pulling port 23 as shown in FIG. 3, the front end $C_1$ of the card C is engaged, in the middle course of such insertion, with the engagement pawls 63 of the slider 6 as shown in FIG. 4. Thereafter, when the card C is inserted into the setting position, the slider 6 follows the card C and advances to the position as shown in FIG. 5. Accordingly, the contacts of the card C come in contact with the contacts of the connector. At the same time, the shaft 7 is swung around the connection pin 71 serving as a fulcrum, so that the operating knob 8 and the holding portion 83 are pushed out to the opposite direction with respect to the slider 6. At the point when the card C is inserted into the setting position, the projection 85 of the operating knob 8 shown in FIG. 2 comes out from the guide groove 25 and the operating knob 8 is further moved int he direction W toward the card inserting/pulling port 23 by the force of the spring 82. Thus, the holding portion 83 projects to and partially closes the inlet of the card inserting/pulling port 23. When the operating knob 8 is pushed out and further moved in the direction W toward the card inserting/pulling port 23 in this way, the holding portion 83 comes in contact with the rear end surface $C_2$ of the card C and, at the same time, the actuator 41 of the microswitch 4 is pushed in by the inner wall surface 84 of the operating knob 8, thus permitting signal transmission/reception between the card C and the machine circuit.

When the holding portion 83 comes in contact with the rear end surface $C_2$ of the card C in this way, the holding portion 83 prevents the card C from being moved int he card C pulling direction Y. This prevents the unexpected accident that the card C is erroneously pulled out with the rear end of the card C held with the hand. Further, the operating knob 8 cannot be manually pushed in. This prevents the unforeseen accident that the operating knob 8 is erroneously pushed in and the card C is erroneously pulled out. The holding portion 83 may be resiliently contacted with the rear end surface $C_2$ by the force of the spring 82, or may be simply contacted with the rear end surface $C_2$. To securely prevent the card C from being erroneously moved in the pulling direction Y, the former resilient-contact state is preferable.

The card C inserted into the setting position may be pulled out in the following manner.

The operating knob 8 located in the position as shown in FIG. 5 is moved sideways of the card inserting/pulling port 23 with, for example, the tip of a finger. With the turned piece 74 serving as a fulcrum, the operating knob 8 is then moved in the direction V away from the card inserting/pulling port 23 against the force of the spring 82. This causes the holding portion 83 to be moved sideways of the card inserting/pulling port 23, so that the inlet of the card inserting/pulling port 23 is fully opened and the projection 85 faces the guide groove 25. At the same time, the inner wall surface 84 of the operating knob 8 is separated from the actuator 41 of the microswitch 4, causing the actuator 41 to project. This provides the state where no inconvenience is caused even though the card C is disconnected from the machine circuit. At this time, when the operating knob 8 is pushed in with the tip of a finger, the projection 85 is fitted in the guide groove 25. Such a pushing movement is transmitted to the slider 6 through the shaft 7, so that the slider 6 is retreated from the position as shown in FIG. 5 to the position as shown in FIG. 4. This causes the card C to be forcibly moved in the pulling direction so that the contacts of the card C are pulled out from the contacts of the connector. Thereafter, the rear end $C_2$ of the card C is pulled out with the hand.

When properly pulling out the card C inserted into the setting position, ti is not desired that the contact group of the card C is separated from the contact group 52 of the connector before the microswitch 4 is switched to the state where no inconvenience is caused even though the card C is disconnected from the machine circuit. To prevent such separation, provision may be made such that, before the card C inserted into the setting position is pulled out so that the contact group of the card C is disconnected from the contact group of the connector, the actuator 41 of the microswitch 4 projects to provide the state where no inconvenience is caused even though the card C is disconnected from the machine circuit.

When the swing portion of the operating knob 8 is disposed by the side of the card inserting/pulling port 23 as done int he connector above-mentioned, the holding portion 83 and the operating knob 8 are not swung in the thickness direction of the connector, so that the connector may be readily made thin. Further, the frame 1 is made of a metallic sheet having a great rigidity, and the slider 6 is disposed as overlapping the frame 1, so that the connector may also be made thin. Further, when provision is made such that the slider, the card inserting/pulling port and the contact group are formed on each of the top side and underside of the frame, there may be formed a connector to which two cards C are used at the same time.

What is claimed is:

1. An electrical connector comprising:
   a rear structure having a card inserting/pulling port;
   a connector body having a contact group which is an assembly of contacts respectively formed on a plurality of contact pieces;
   a frame to which said rear structure and said connector body are attached such that said card inserting/pulling port and said contact group face each other with a distance provided therebetween;
   a slider longitudinally movably disposed, as overlapping said frame, between said card inserting/pulling port and said contact group;
   engagement pawls disposed at said slider and adapted to be engaged, only in the card insertion direction, with a card when the same is inserted through said card inserting/pulling port;
   a shaft provided at the intermediate portion thereof with a swing fulcrum, said shaft having one end connected to said slider and the other end which transversely extends outside of said frame;
   an operating knob connected, sideways of said card inserting/pulling port, to said other end of said shaft, said operating knob being swingable in the directions toward and away from said card inserting/pulling port;

a spring for resiliently biasing said operating knob normally in the direction toward said card inserting/pulling port; and a holding portion disposed at the free end of said operating knob and adapted to project to and partially close the inlet of said card inserting/pulling port when said operating knob approaches said card inserting/pulling port.

2. An electrical connector according to claim 1, wherein the slider has a stepped portion and is provided at the front of said stepped portion with a wide slider body and at the rear of said stepped portion with a narrow tongue piece, said slider body being provided at both transverse sides of a tip thereof with guide pieces which project outwardly therefrom, said guide pieces being guided in the longitudinal direction of said connector by the body of said connector, said tongue piece being guided, as housed in a longitudinal guide hole formed in the frame, in the longitudinal direction of said connector.

3. An electrical connector according to claim 1, wherein the slider has a stepped portion and is provided at the front of said stepped portion with a wide slider body and at the rear of said stepped portion with a narrow tongue piece, said slider body being provided at both transverse sides of a tip thereof with guide pieces which project outwardly therefrom, said guide pieces being guided in the longitudinal direction of said connector by the body of said connector, said tongue piece being guided, as housed in a longitudinal guide hole formed in the frame, in the longitudinal direction of said connector.

4. An electrical connector according to claim 1, wherein the card inserting/pulling port of the rear structure is formed by two opposite groove forming portions and a bottom plate disposed therebetween, one of said groove forming portions having a frame portion which incorporates a microswitch of which an actuator faces the inner wall surface of the operating knob.

5. An electrical connector according to claim 1, wherein the swing fulcrum of the shaft is formed by attaching the intermediate portion of said shaft to the frame by a connection pin.

6. An electrical connector according to claim 1, wherein the engagement pawls stand from both transverse sides of a tip of the body of the slider.

7. An electrical connector according to claim 1, wherein the swing portion of the operating knob is disposed sideways of the card inserting/pulling port.

* * * * *